(12) United States Patent
Lin et al.

(10) Patent No.: US 11,563,006 B2
(45) Date of Patent: Jan. 24, 2023

(54) SEMICONDUCTOR STRUCTURE AND METHOD FOR MANUFACTURING THEREOF

(71) Applicant: TAIWAN SEMICONDUCTOR MANUFACTURING COMPANY LTD., Hsinchu (TW)

(72) Inventors: Meng-Han Lin, Hsinchu (TW); Han-Jong Chia, Hsinchu (TW); Sai-Hooi Yeong, Hsinchu County (TW); Chenchen Jacob Wang, Hsinchu (TW); Yu-Ming Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 119 days.

(21) Appl. No.: 16/911,338

(22) Filed: Jun. 24, 2020

(65) Prior Publication Data

US 2021/0408003 A1    Dec. 30, 2021

(51) Int. Cl.
*H01L 27/108* (2006.01)
*H01L 29/06* (2006.01)
(Continued)

(52) U.S. Cl.
CPC .. *H01L 27/10811* (2013.01); *H01L 27/10855* (2013.01); *H01L 27/10873* (2013.01); *H01L 28/87* (2013.01); *H01L 29/0649* (2013.01); *H01L 29/0673* (2013.01); *H01L 29/42392* (2013.01); *H01L 29/6675* (2013.01);
(Continued)

(58) Field of Classification Search
CPC ......... H01L 27/10811; H01L 27/10855; H01L 27/10873; H01L 28/87; H01L 29/0649; H01L 29/0673; H01L 29/42392; H01L 29/66742; H01L 29/6675; H01L 29/66969; H01L 29/78654; H01L 29/78672; H01L 29/7869
See application file for complete search history.

(56) References Cited

U.S. PATENT DOCUMENTS 9,209,247 B2    12/2015    Colinge et al.
9,236,267 B2     1/2016    De et al.
(Continued)

FOREIGN PATENT DOCUMENTS

WO    WO-2020237543 A1 * 12/2020 ............. H01G 4/005

*Primary Examiner* — Edward Chin
(74) *Attorney, Agent, or Firm* — WPAT; Anthony King

(57) ABSTRACT

A semiconductor structure is provided. The semiconductor structure includes a substrate, a front end of line (FEOL) structure, and a metallization structure. The FEOL structure is disposed over the substrate. The metallization structure is over the FEOL structure. The metallization structure includes a transistor structure, an isolation structure, and a capacitor. The transistor structure has a source region and a drain region connected by a channel structure. The isolation structure is over the transistor structure and exposing a portion of the source region, and a side of the isolation structure has at least a lateral recess vertically overlaps the channel structure. The capacitor is in contact with the source region and disposed conformal to the lateral recess. A method for manufacturing a semiconductor structure is also provided.

20 Claims, 16 Drawing Sheets

(51) Int. Cl.
  *H01L 29/423*  (2006.01)
  *H01L 29/786*  (2006.01)
  *H01L 29/66*  (2006.01)
  *H01L 49/02*  (2006.01)

(52) U.S. Cl.
  CPC .. *H01L 29/66742* (2013.01); *H01L 29/66969* (2013.01); *H01L 29/7869* (2013.01); *H01L 29/78654* (2013.01); *H01L 29/78672* (2013.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2021/0305358 A1* | 9/2021 | Naskar ............... H01G 4/38 |
| 2021/0376165 A1* | 12/2021 | Tsai ................ H01L 29/7869 |

\* cited by examiner

SEMICONDUCTOR STRUCTURE AND METHOD FOR MANUFACTURING THEREOF

FIELD

The present disclosure relates to a semiconductor structure and method for manufacturing thereof, particularly, the disclosed semiconductor structure has a stackable capacitor over a front end of line (FEOL) structure, and therefore may be implemented as a three dimensional dynamic random access memory (3D-DRAM) in a back end of line (BEOL) structure for improving the density and the performance of the memory.

BACKGROUND

Generally, a random access memory (RAM) includes memory cells that each store a bit "0" or "1" of data when a write operation is performed thereon that can be retrieved later by performing a read operation. In RAMs, the amount of time to write data thereto is about the same as the amount of time to read data therefrom. A RAM can be volatile or non-volatile. The volatile RAM requires power to retain data stored therein. As opposed to the volatile RAM, the non-volatile RAM ensures data retention even after the power is removed. The memory cells of the volatile RAM, such as a dynamic RAM (DRAM), each include a capacitor that is either in a charged state or a discharged state. These two states represent the two bits of data.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
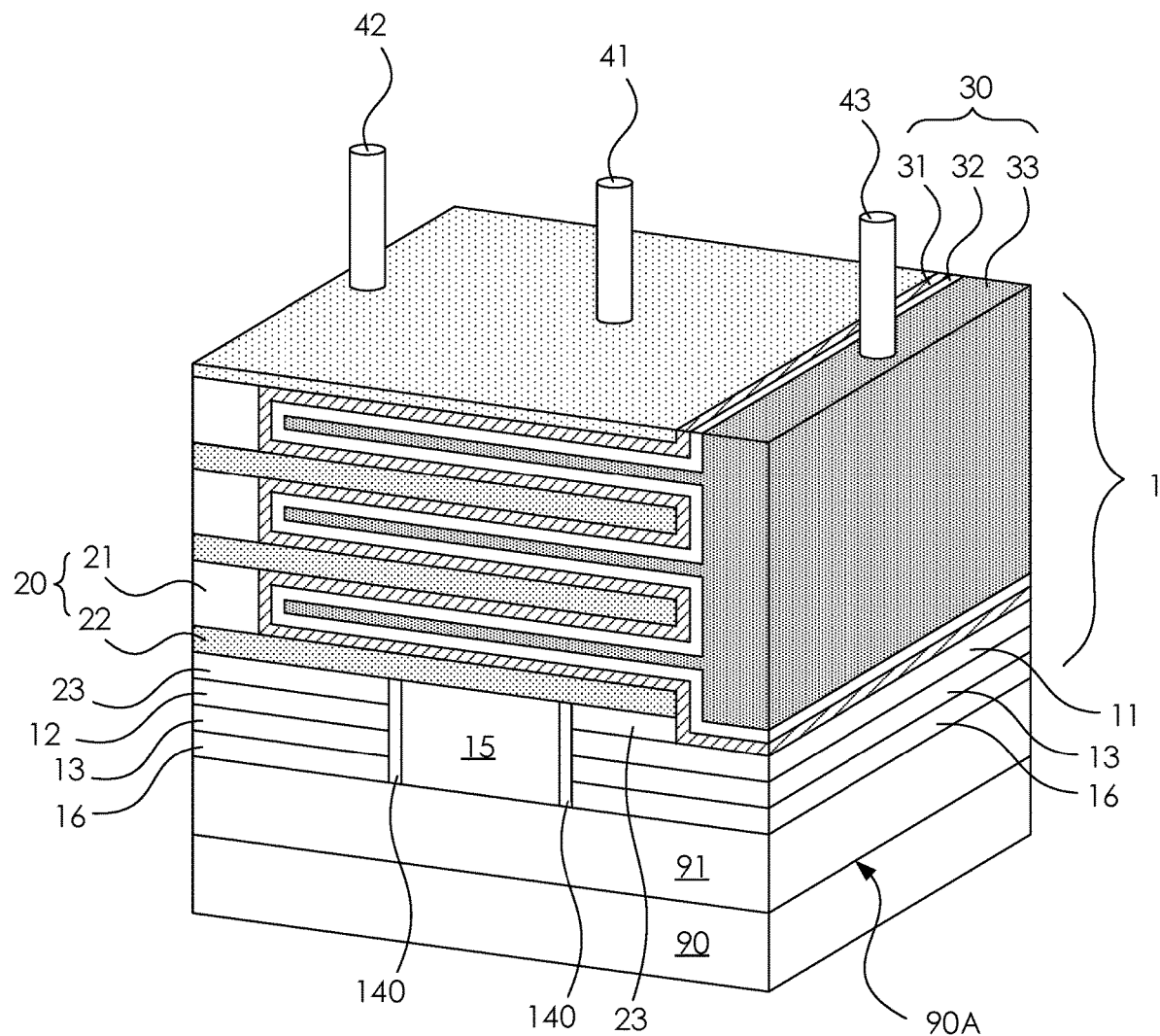
FIG. 1 depicts a three dimensional illustration of a semiconductor structure according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

Dynamic access random memory (DRAM) has been playing an important role in the modern electronics device due to its advantages such as high-speed operation, wide bandwidth, small feature size, and high endurance. Generally, in integrating the DRAM into the logic devices, the DRAM is usually embedded into the front end of line (FEOL) structure, or be more precisely, an access transistor of the DRAM is usually made in the FEOL process, whereas an access capacitor of the DRAM may be made there over with a DRAM bit connected to the access capacitor from the BEOL structure to the drain of the access transistor in the FEOL structure.

In order to enhance the reading performance and the reliability of the DRAM, such as providing sufficient memory window and soft error resilience, several high-k dielectric materials (e.g., k>30) is usually be utilized in manufacturing the DRAM with large storage capacitance (or diffusion capacitance, $C_D$). However, such structure of DRAM (i.e., a transistor made in FEOL process and a capacitor made in BEOL process) is hard to be integrated into a general logic device process.

Accordingly, some embodiments of the present disclosure provide a semiconductor structure which has a transistor and a capacitor both be made in the BEOL process, and the capacitor over the FEOL structure may provide higher capacitance by a stackable structure. Through breaking the limitation within a planar area, the semiconductor structure in the present disclosure may keep a sufficient capacitance of DRAM and may further be utilized in applications which require memory with high density and high performance, for example, the CuA (CMOS under the Array) applications.

FIG. 1 illustrates a semiconductor structure which includes a 3D DRAM in a BEOL structure according to some embodiments of the present disclosure. As shown in the figure, the semiconductor structure includes a substrate 90, a FEOL structure 91, and a metallization structure 1. The FEOL structure 91 is disposed over or formed at a first surface 90A of the substrate 90. The metallization structure 1 is disposed over the FEOL structure 91.

In some embodiments, the substrate 90 is a silicon substrate. In some embodiments, the substrate 90 may be made by some other semiconductor material such as germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used. Additionally, the substrate 90 may include a silicon-on-insulator (SOI) substrate. Generally, an SOI substrate includes a layer of semiconductor material such as epitaxial silicon, germanium, silicon germanium, SOI, silicon germanium on insulator (SGOI), or combinations thereof. The substrate 90 may be doped with a p-type dopant such as boron, boron fluorine, aluminum, gallium, or the like. The substrate may alternatively be doped with an n-type dopant such as phosphorus, arsenic, antimony, or the like.

The FEOL structure 91 may include various kinds of individual devices and an interlayer insulating layer. The individual devices may include various microelectronic devices, for example, an image sensor such as metal-oxide-semiconductor field effect transistor (MOSFET), large scale integration (LSI) system, complementary metal-oxide-semiconductor (CMOS) imaging sensor (CIS), micro-electro-mechanical system (MEMS), active device, passive device, and the like. The individual devices may be electrically connected to a conductive region of the substrate 90. In addition, the individual devices may be electrically isolated from adjacent individual devices by the interlayer insulating layer, respectively.

In some embodiments, the metallization structure 1 includes a transistor structure 10 (later shown in FIG. 2A), an isolation structure 20, and a capacitor structure 30. The transistor structure 10 disposed over the FEOL structure 91 includes a source region 11 and a drain region 12 connected by a channel structure 13. The isolation structure 20 is disposed over the transistor structure 10. The capacitor structure 30 is disposed over the isolation structure 20.

Figure 2A:
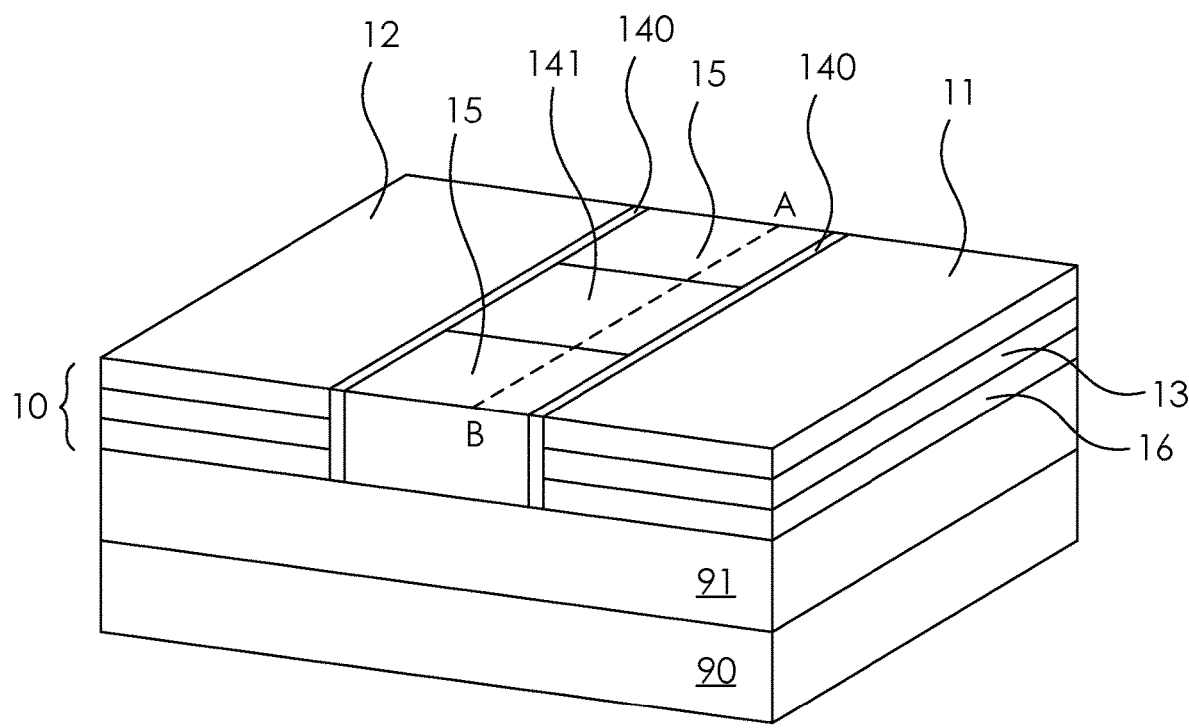
FIG. 2A depicts a three dimensional illustration of a portion of a semiconductor structure according to some embodiments of the present disclosure.
Figure 2B:
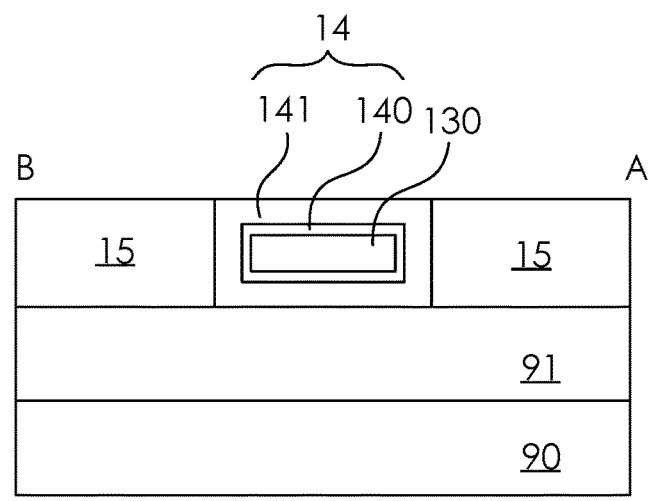
FIG. 2B illustrates a cross-sectional view of a portion of a semiconductor structure according to some embodiments of the present disclosure.

As shown in FIGS. 2A and 2B, wherein FIG. 2B is a cross-sectional view of 2A along line AB, in some embodiments, the transistor structure 10 may include a gate-all-around (GAA) structure. In such embodiments, the channel structure 13 includes at least a channel sheet 130 between the source region 11 and a drain region 12. The channel sheet 130 is wrapped by a gate structure 14.

The GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 2C:
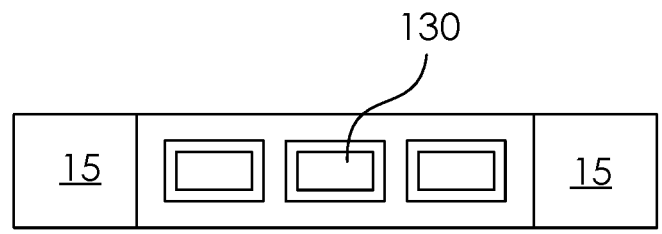
FIGS. 2C to 2E illustrate cross-sectional views of channel sheets according to some embodiments of the present disclosure.
Figure 2D:
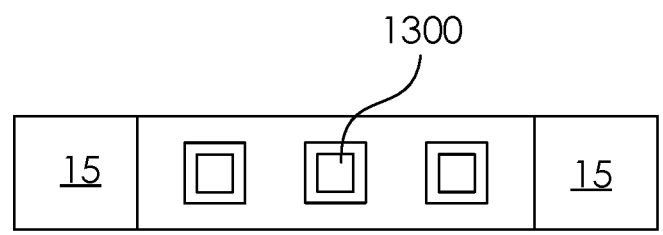
Figure 2E:
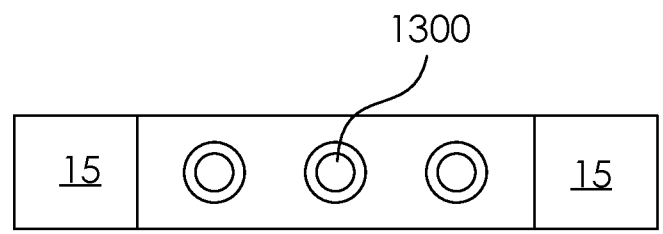

As shown in FIG. 2B, in some embodiments, the gate structure 14 may include a gate dielectric 140 wrapping the channel sheet 130, and a metal gate 141 wrapping the gate dielectric 140. As shown in FIGS. 2C, 2D, and 2E, the number of the channel sheet 130 may varied, and a nanosheet feature of the channel sheet 130 may be replaced by a nanowire feature 1300, which include a square or a round cross section, depending on the requirement of driving current for DRAM operation.

In some embodiments, the metal gate 141 may be laterally surrounded by a metal gate isolation material 15 for isolating the metal gate 141 from other transistor structures in an array application, for example. In some embodiments, the transistor structure 10 may optionally include an isolation film 16 underneath, for instance, the isolation film 16 may be disposed between the channel structure 13 and the FEOL structure 91.

In some embodiments, referring to FIG. 1 and FIG. 2A, a portion of the source region 11 of the transistor structure 10 is not covered by an isolation layers 22 of the isolation structure 20. The non-covered portion of the source region 11 may be utilized to provide a connection between the transistor structure 10 and the capacitor structure 30. As mentioned previously, the semiconductor structure in the present disclosure includes a 3D DRAM in a BEOL structure, such feature regarding the 3D structure may be achieved by a stackable capacitor.

Figure 3A:
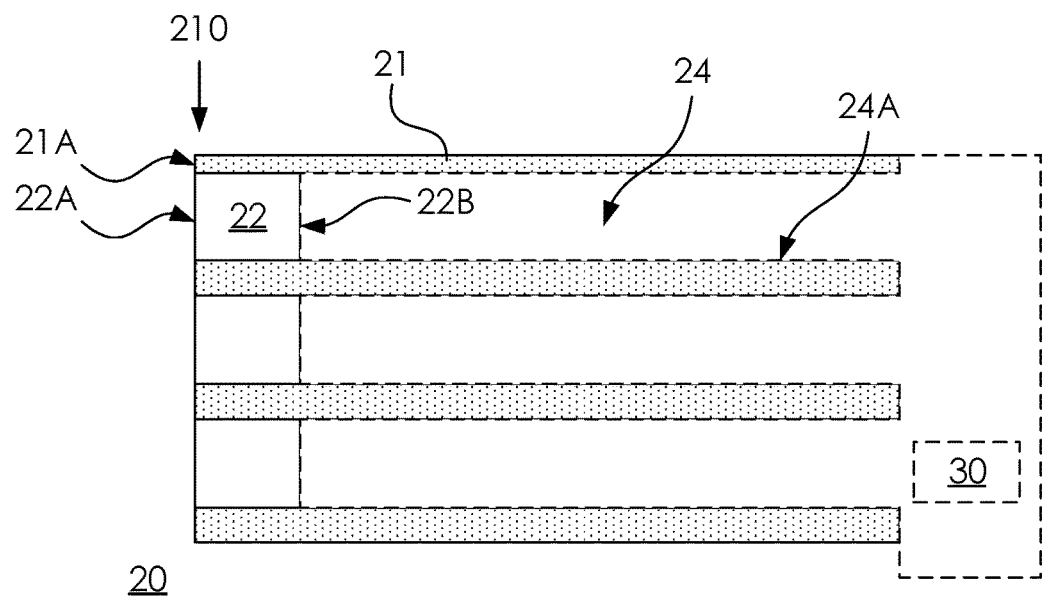
FIG. 3A illustrates a cross-sectional view of an isolation structure according to some embodiments of the present disclosure.
Figure 3B:
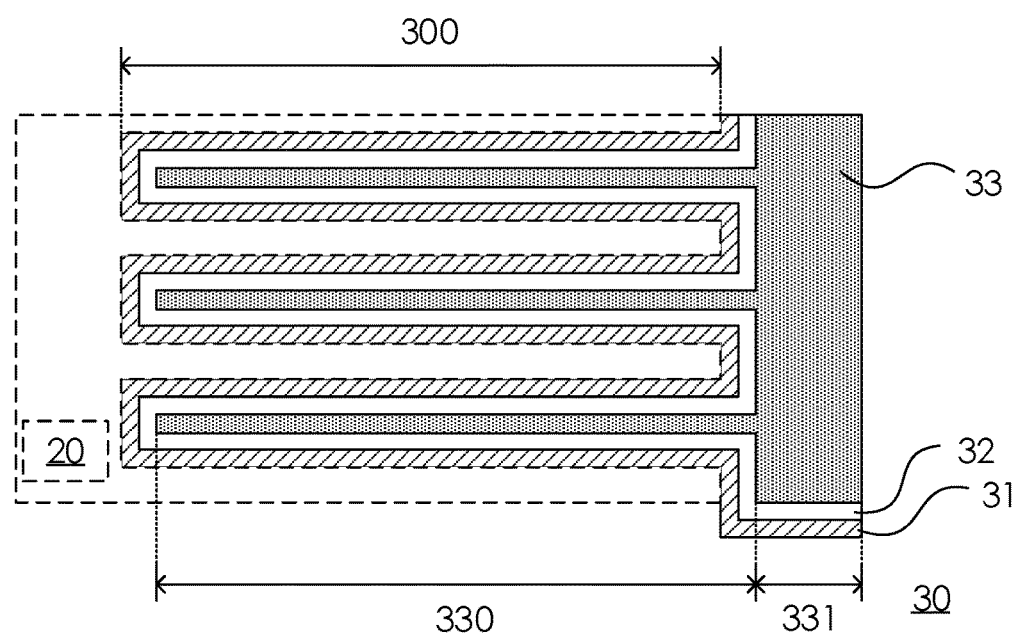
FIG. 3B illustrates a cross-sectional view of a capacitor structure according to some embodiments of the present disclosure.

To be more detailed, as shown in FIGS. 3A and 3B, wherein FIG. 3A is utilized to illustrate the isolation structure 20 and FIG. 3B is utilized to illustrate the capacitor structure 30. In some embodiments, the isolation structure 20 includes at least a lateral recess 24 vertically overlaps the channel structure, particularly, overlaps the channel sheet 130 (previously shown in FIG. 1 and FIG. 2B). In some embodiments, the lateral recess 24 is defined by a plurality of first isolation layers 21 as will be discussed in the present disclosure. The one or more lateral recesses 24 may be utilized to accommodate a portion of the capacitor structure 30, for instance, the capacitor structure 30 may include at least a lateral fin structure 300 which is conformal to the lateral recess 24 and is thus disposed therein.

The capacitance C of a capacitor is proportional to the area of the conductor plates thereof, and therefore in some embodiments, the capacitor structure 30 may include a plurality of lateral fin structures 300 for increasing the capacitance through having more area of the conductor plates. In some embodiments, the number of the lateral fin structure 300 may be increased by stacking a plurality of capacitors structure 30 over the transistor structure 10. In some embodiments, the number of the lateral recess 24 of the isolation structure 20 is identical to that of the lateral fin structure 300 of the capacitor structure 30, or the total lateral fin structures 300 of the stacked capacitors structure 30.

As shown in FIGS. 3A and 3B, each of the capacitor structure 30 in the present disclosure may include a bottom metal layer 31, a dielectric layer 32, and a top metal layer 33. In some embodiments, a portion of the bottom metal layer 31 is in contact with the source region 11 (previously shown in FIG. 1), and another portion is disposed conformal to a sidewall 24A of the lateral recess 24. In some embodiments, the dielectric layer 32 is disposed on the bottom metal layer 31 and is also disposed conformal to the bottom metal layer 31 in the lateral recess 24. In some embodiments, the top metal layer 33 is disposed on the dielectric layer 32 and laterally covers the dielectric layer 32 and the lateral recess 24.

Accordingly, in each of the lateral fin structures 300 of the capacitor structure 30, the top metal layer 33 may include a fin portion 330 be implemented as a core body of the lateral fin structures 300, and the dielectric layer 32 and the bottom metal layer 31 may cover the surface of the top metal layer 33 sequentially for providing a structure that a dielectric material sandwiched by two conductive materials. On the other hand, due to the conformal relationship between the lateral fin structures 300 and the lateral recess 24, the bottom metal layer 31 and the dielectric layer 32 may be disposed along the inner surface of the lateral recess 24 sequentially, which may be seems as a folding structure that alternated over the transistor 10.

Regarding the relationship between the layers of the capacitor structure 30 and the transistor structure 10 there below, in some embodiments, the top metal layer 33 may further include a base portion 331 connect to a side of each of the fin portions 330. In some embodiments, the base portion 331 is disposed over the source region 11, whereas the fin portions 330 extended horizontally from the side proximity to the source region 11 to the side proximity to drain region 12.

As shown in FIGS. 3A and 3B, in some embodiments, the isolation structure 20 may include a plurality of first isolation layers 21 and a plurality of second isolation layers 22. In some embodiments, the first isolation layers 21 are arranged alternated with the fin portions 330 of the top metal layer 33 over the transistor structure 10. In some embodiments, the fin portions 330 and the first isolation layers 21 overlap the channel structure 13 from a top view perspective. In some embodiments, the second isolation layers 22 are arranged alternated with the first isolation layers 21. In some embodiments, the second isolation layers 22 are disposed in proximity to an end 210 of the first isolation layers 21. In some embodiments, a side surface 21A of each of the first isolation layers 21 and a side surface 22A of each of the second isolation layers 22 are substantially forming a continuous line at the end 210 from a cross sectional perspective. In some embodiments, another side surface 22B of each of the second isolation layers 22 is facing and in contact with the lateral fin structures 300 of the capacitor structure 30. In some embodiments, each of the side surfaces 22B is in contact with the bottom metal layer 31.

In some embodiments, the material of the first isolation layers 21 and the material of the second isolation layers 22 are different. For instance, the material of the first isolation layers 21 may possess a different etching selectivity from that of the material of the second isolation layers 22. Such difference in etching selectivity may be utilized to form the lateral recess 24 in an etching operation, which will be described later.

As shown in FIG. 1, in some embodiments, the semiconductor structure of the present disclosure may include an etch stop layer 23 on the transistor structure 10 and exposing a portion of the source region 11 for electrical contact. In such embodiments, the etch stop layer 23 is in contact with the first isolation layers 21 closest to the transistor structure 10. In some embodiments, the material of the etch stop layer 23 is different to a material of the first isolation layer 21.

Still referring to FIG. 1, in some embodiments, the semiconductor structure further includes a gate contact 41 electrically coupled to the gate structure 14 and surrounded by the isolation structure 20 and the capacitor structure 30. In some embodiments, the gate contact 41 is disposed over the metal gate 141 (previously shown in FIG. 2A). In such embodiments, each of the first isolations layer 21 and the capacitor structure 30 is penetrated by the gate contact 41. Moreover, in some embodiments, the gate contact 41 is laterally surrounded by sidewall oxides for avoiding short circuit. The gate contact 41 may be implemented as a word line of the DRAM.

In some embodiments, the semiconductor structure further includes a drain contact 42 electrically coupled to the drain region 12 of the transistor structure 10. In some embodiments, the drain contact 42 is disposed in proximity to the end 210 of the first isolation layers 21 as previously shown in FIG. 3A, and therefore the drain contact 42 may be surrounded by the isolation structure 20 without in contact with the top metal layer 33 and the bottom metal layer 31 of the capacitor structure 30. Accordingly, a sidewall oxide layer surrounding the drain contact 42 may not be necessary to avoid short circuit in such embodiments. In some other embodiments, the drain contact 42 is disposed further from the end 210 of the first isolation layers 21 and toward a gate contact 41 (not depicted in FIG. 3A). The drain contact 41 can be formed concurrently with the operation of forming the gate contact 41, and under such embodiment, the drain contact 42 may be surrounded by a sidewall oxide layer. The drain contact 42 may be implemented as a bit line of the DRAM.

In some embodiments, the semiconductor structure further includes a source contact 43 electrically coupled to the top metal layer 33 of the capacitor structure 30. The source contact 43 may be formed on the base portion 331 of the top metal layer 33 as previously shown in FIG. 3B. The source contact 43 may be implemented as a word line of the DRAM.

Figure 4A:
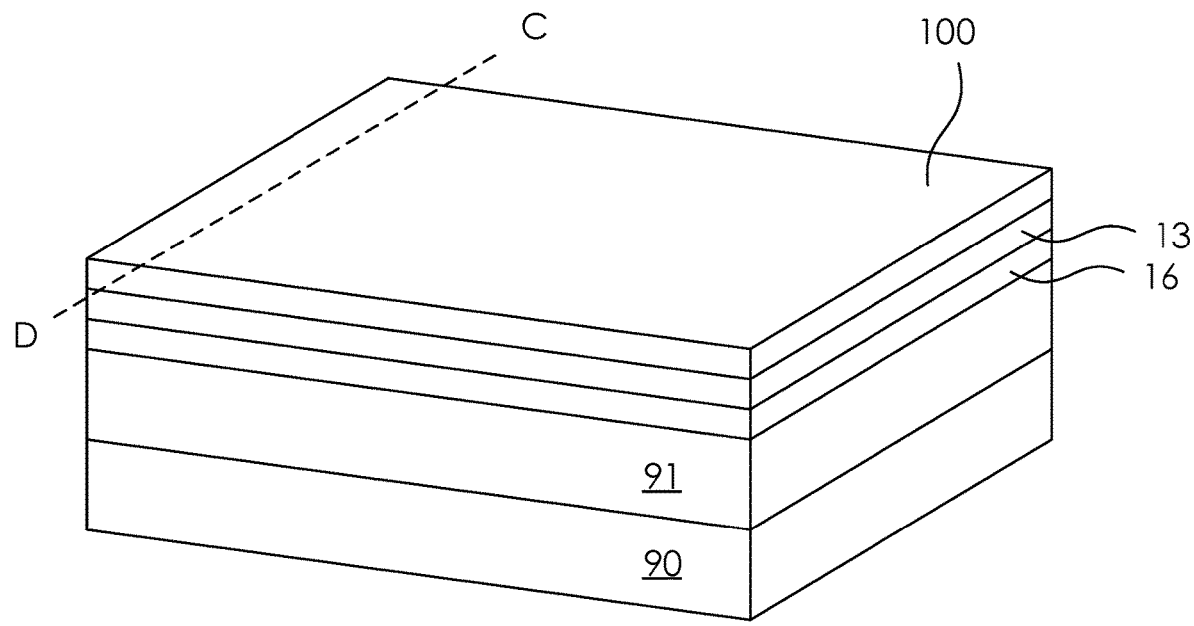
FIG. 4A depicts a three dimensional illustration of a portion of a semiconductor structure according to some embodiments of the present disclosure.

The forming of the semiconductor structure in the present disclosure may include various operations. As shown in FIG. 4A, the substrate 90 having the FEOL structure 91 over the first surface 90A of the substrate 90 is received, and the isolation film 16 and the channel structure 13 are disposed over the FEOL structure 91 in subsequent operations. In some embodiments, the material of the channel structure 13 may be silicon or polysilicon, indium gallium zinc oxide (IGZO), zinc oxide (ZnO), or the like. The transistor of the 3D DRAM in the present disclosure is formed in the BEOL process, and thus it is more flexible in choosing the material for forming the channel structure 13. Next, a source/drain material 100 may be formed on the channel structure 13, wherein the source/drain material 100 may be made by metal such as aluminum (Al), titanium (Ti), titanium nitride (TiN), tantalum nitride (TaN), cobalt (Co), silver (Ag), gold (Au), copper (Cu), nickel (Ni), chromium (Cr), hafnium (Hf), ruthenium (Ru), tungsten (W), platinum (Pt), etc.

Figure 4B:
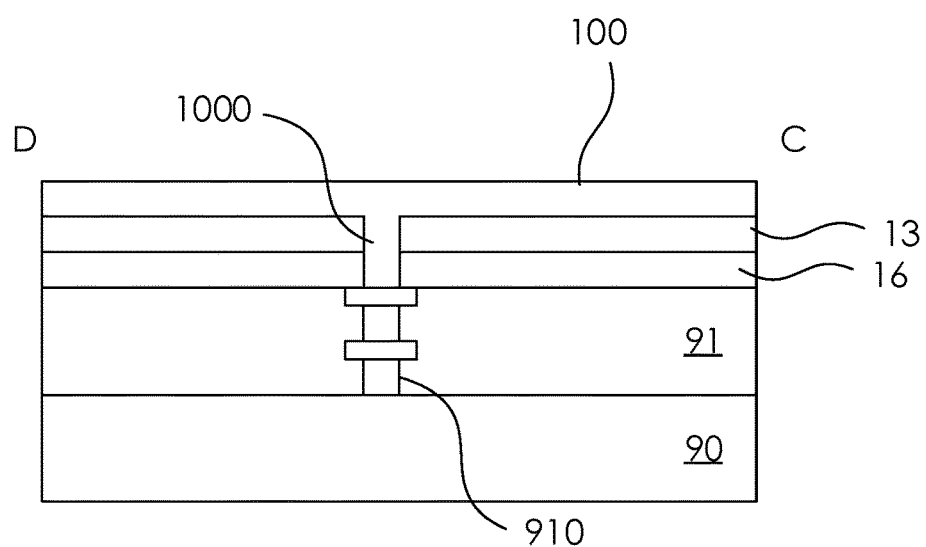
FIG. 4B illustrates a cross-sectional view of a portion of a semiconductor structure according to some embodiments of the present disclosure.

Since the FEOL structure 91 is covered by the an isolation film 16, in some embodiments, in order to form electrical connection between the BEOL structure and the FEOL structure 91, a trench may be formed through the isolation film 16 and the channel layer 13 prior to forming the drain region, so as to expose a top surface of CuA formed in the FEOL structure 91. In the operation of depositing the source/drain material 100 on the channel structure 13, as shown in FIG. 4B, which is a cross-sectional view of 4A along line CD, the trench may be filled by the source/drain material 100 to form a bit line 1000 electrically coupling the CuA 910 in FEOL structure 91 and the transistor structure in the BEOL structure.

Figure 5:
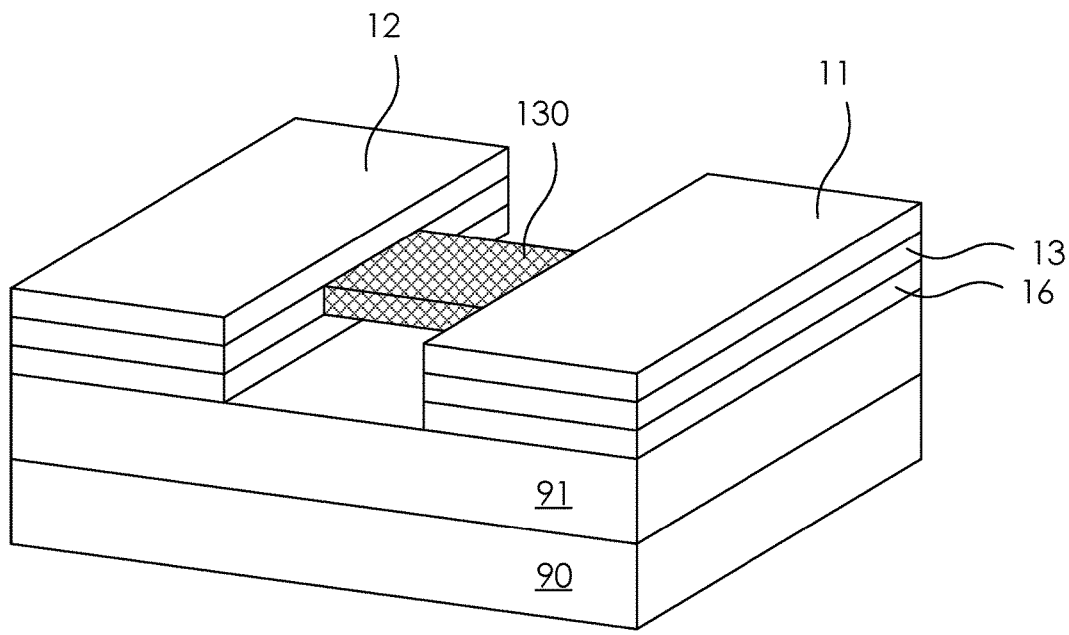
FIGS. 5 to 9 depict three dimensional illustrations of forming a transistor structure of semiconductor structure according to some embodiments of the present disclosure.

As shown in FIG. 5, in the operation of forming the channel sheet 130, a trench etching operation may be applied to expose the channel structure 13 from the source/drain material 100, and then a wet etching process may be applied subsequently to remove a portion of the channel structure 13 and the isolation film 16. In such operation, the isolation film 16 below the channel sheet 130 is also removed, and the channel sheet 130 may overhang the FEOL structure 91. Moreover, various numbers and the geometries of the channel sheet 130 as previously shown in FIGS. 2B to 2E may be defined through these etching operations.

Figure 6:
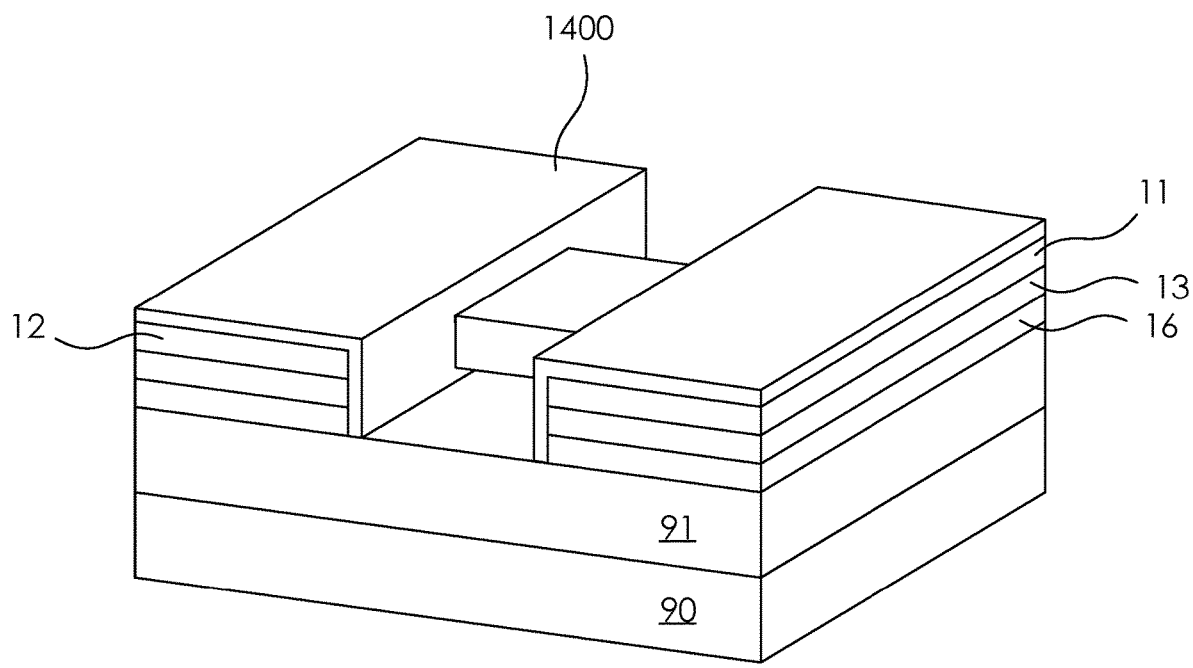

As shown the changes from FIG. 5 to FIG. 6, a gate dielectric material 1400 is deposited on source region 11, the drain region 12, and the channel sheet 130 after the channel sheet 130 is formed. In some embodiments, the channel sheet 130 is thus wrapped by the gate dielectric material 1400 from all sides except for the two opposing ends connecting to the channel structure 13. The lateral sides of the isolation film 16, the channel structure 13, the source region 11 and the drain region 12 proximity to the channel sheet 130 are covered by the gate dielectric material 1400 as well. The gate dielectric material 1400 disposed on the lateral sides as abovementioned may be utilized to prevent short circuit.

Figure 7:
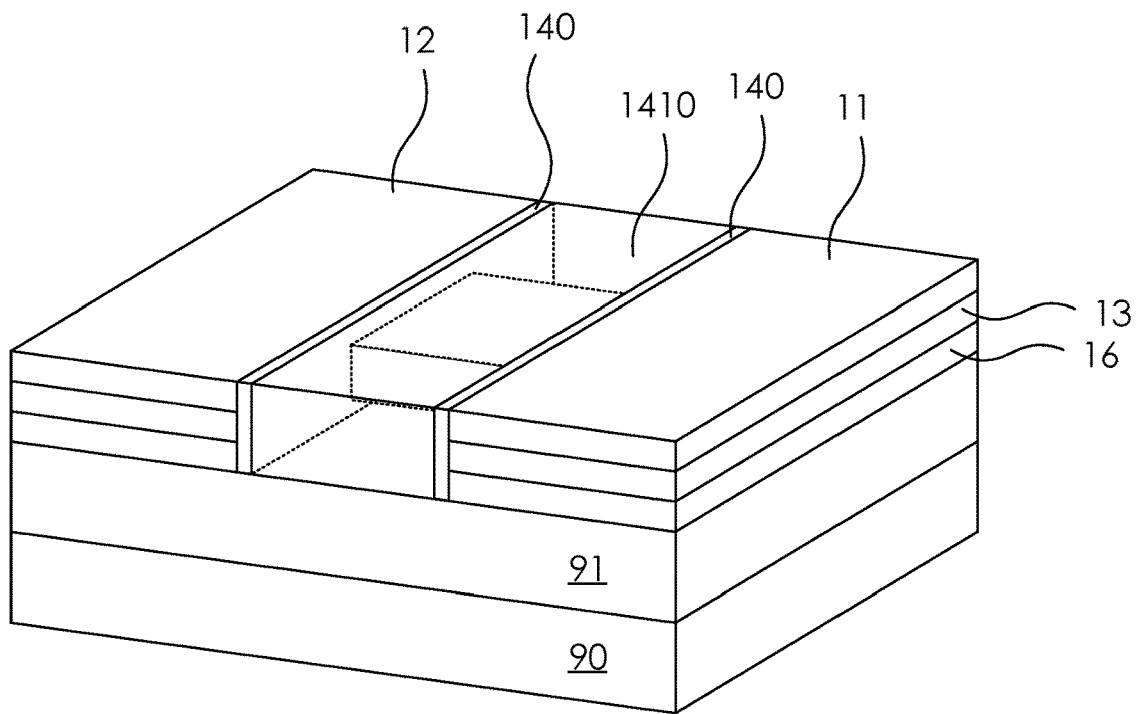

Referring to changes from FIG. 6 to FIG. 7, the gate dielectric material 1400 over the source region 11 and the drain region 12 may be removed afterwards. In some embodiments, the trench previously formed in the operation of forming the channel sheet 130 may be filled by a metal gate material 1410 such as TiN, suitable work function metal layers, or the like. At the completion of the metal gate material 1410 formation, the channel sheet 130 previously wrapped by the gate dielectric 140 may be further wrapped by the metal gate material 1410. After the trench is filled, excess metal gate material 1410 and the gate dielectric material over the source region 11 and the drain region 12 may be removed to expose the source region 11 and the drain region 12 by a planarization operation, for example, a chemical mechanical polishing (CMP) operation.

Figure 8:
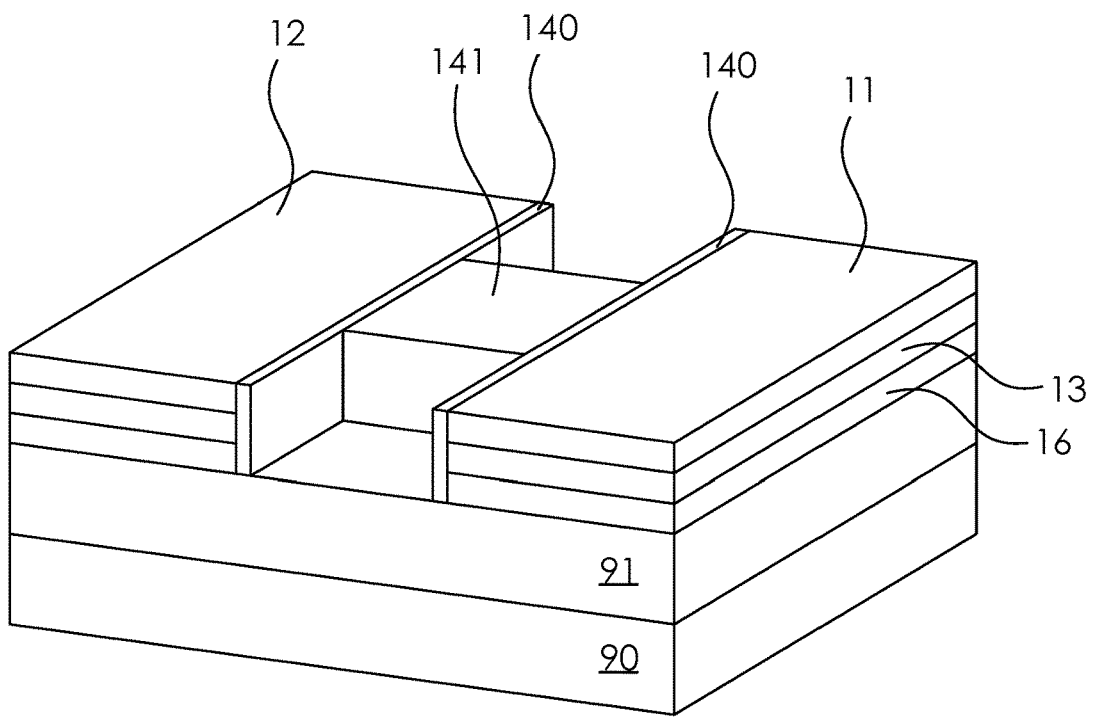
Figure 9:
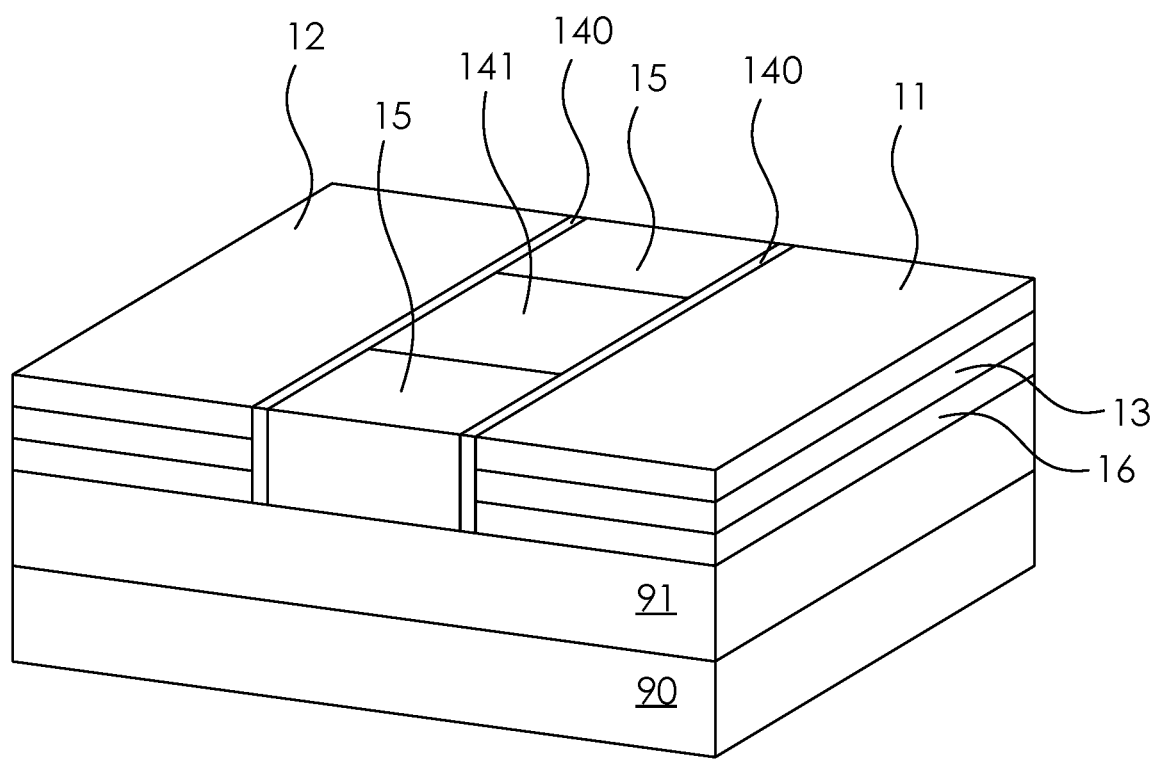

Referring to FIG. 8 and FIG. 9, in order to isolate the metal gate 141 in other device regions on the substrate (not shown in FIG. 8), one or more portions of the metal gate 141 may be removed by etching. As shown in FIG. 9, the spaces formed by removing the metal gate 141 may be filled by the metal gate isolation material 15. Accordingly, the metal gate 141 may be laterally surrounded by a metal gate isolation material 15, as previously shown in FIG. 2A.

Figure 10A:
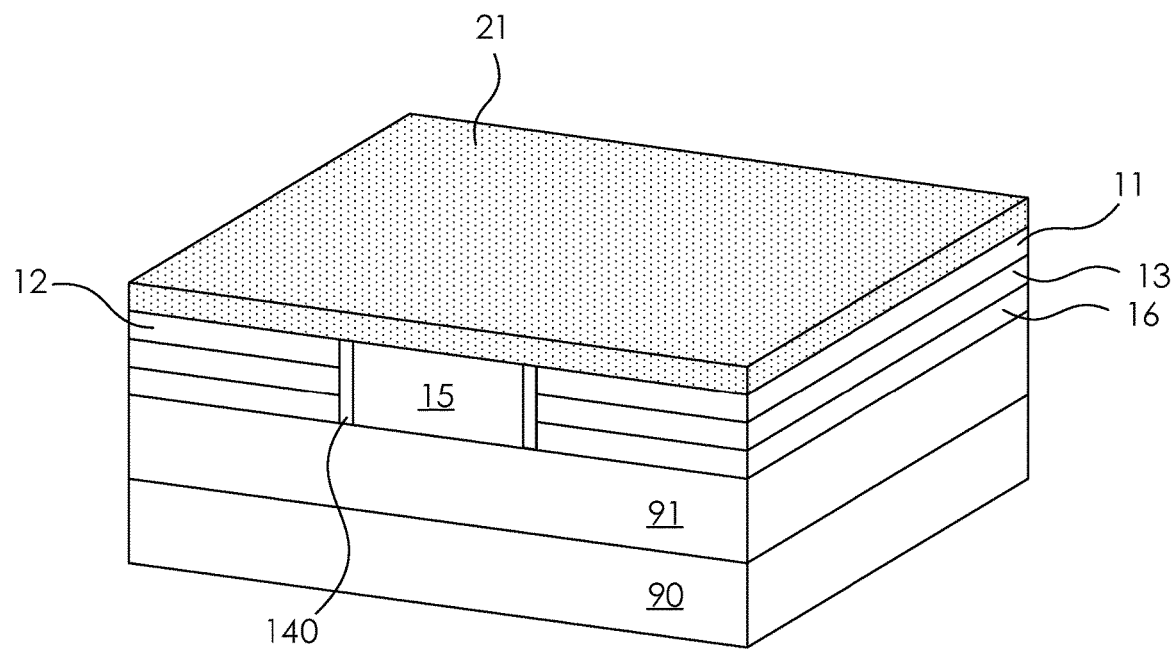
FIG. 10A depicts a three dimensional illustration of forming a first isolation layer according to some embodiments of the present disclosure.
Figure 10B:
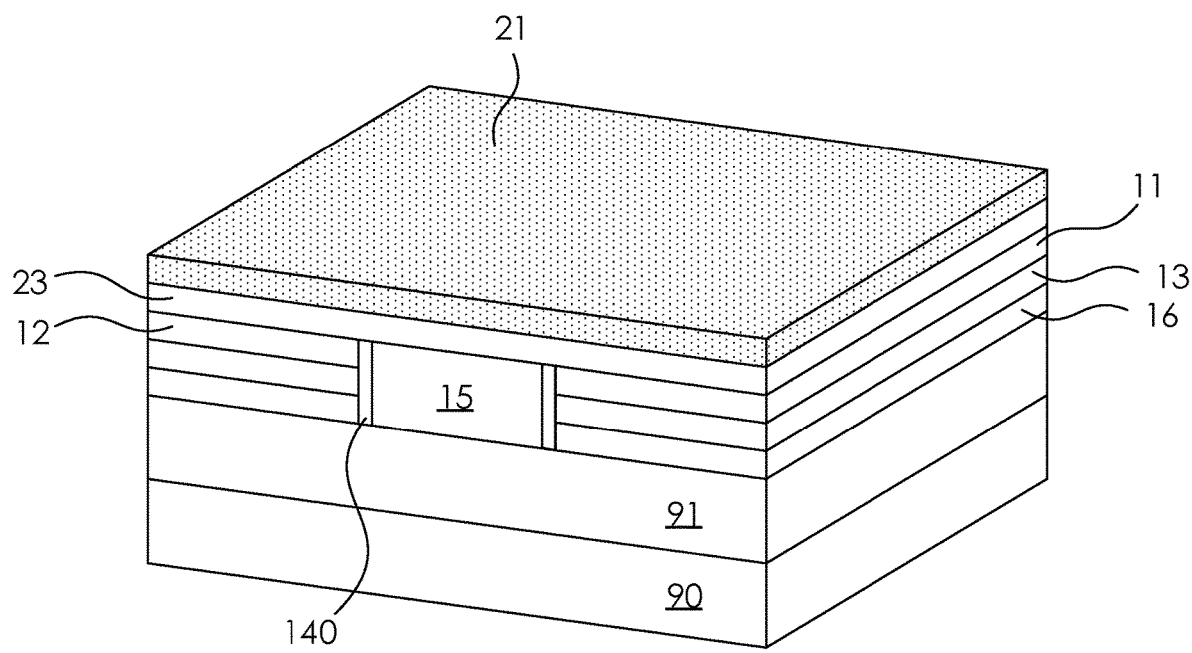
FIG. 10B depicts a three dimensional illustration of forming an etch stop layer according to some embodiments of the present disclosure.

After the metal gate 141 is sandwiched by the metal gate isolation material 15, the transistor structure 10 may be covered by the isolation structure 20 subsequently. As illustrate in FIG. 10A, in some embodiments, the first isolation layer 21 may be formed on the transistor structure and thus covers the source region 11 and the drain region 12. As illustrate in FIG. 10B, in some other embodiments, the etch stop layer 23 may be formed on the transistor structure prior to forming the isolation structure. The etch stop layer 23 may prevent the damage to the transistor structure during the formation of the lateral recesses. Accordingly, the etch stop layer 23 has a lower etch selectivity than the first isolation layer 21.

Figure 11:
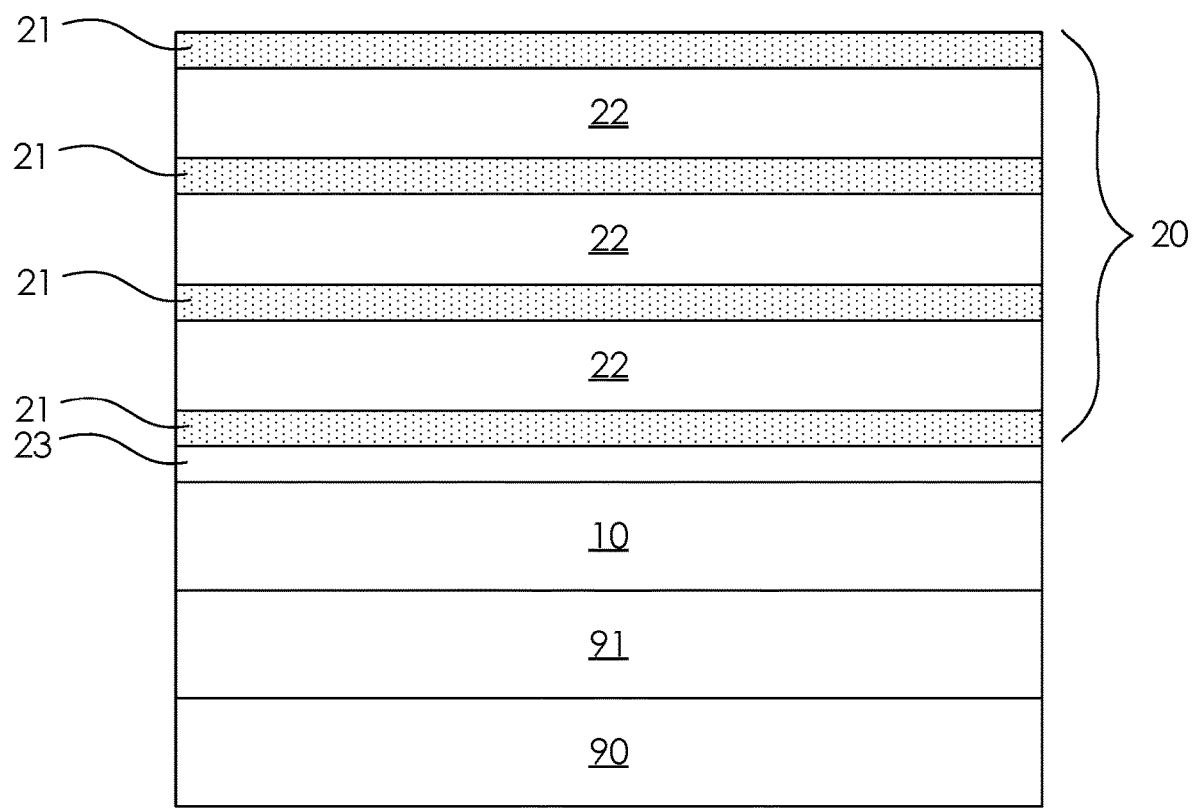
FIGS. 11 to 13 illustrate cross-sectional views of forming an isolation structure according to some embodiments of the present disclosure.

As shown in FIG. 11, in some embodiments, a plurality of first isolation layers 21 and a plurality of second isolation layers 22 may be formed alternatively over the transistor structure 10. As aforementioned, the material of the first isolation layers 21 and the material of the second isolation layers 22 are different. For instance, the first isolation layers 21 may be made by oxides such as TEOS, whereas the second isolation layers may be made by nitrides such as SiN. Other oxides, nitrides, and metals may be implemented as well, depends on the etching selectivity of the first isolation layers 21 and the second isolation layers 22 is sufficient to form the lateral recess in the isolation structure 20. The number of the first isolation layers 21 and the second isolation layers 22 may vary in different applications; generally, the number of the first isolation layers 21 and the second isolation layers 22 disposed alternatively or stacked over the transistor structure is depending on the requirement of DRAM storage capacitance. That is, the more isolation layers stacked, the more lateral recesses may be later formed afterwards, and thereby more area of the conductor plates (i.e., the bottom metal layer 31 and the top metal layer 33) may be provided.

Figure 12:
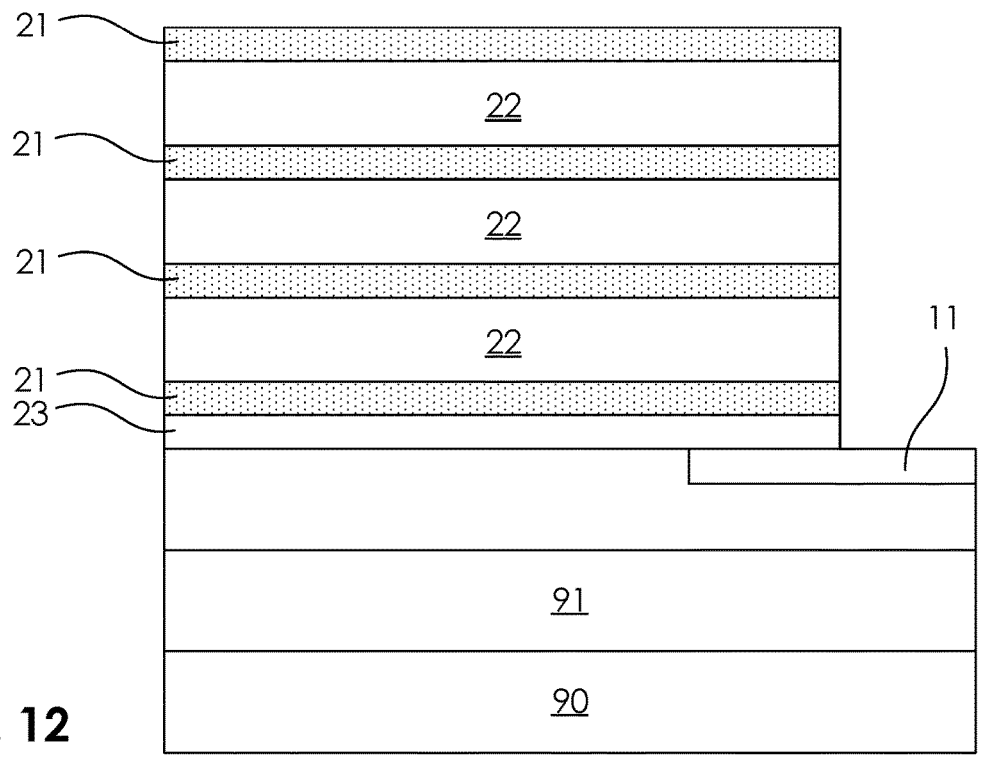
Figure 13:
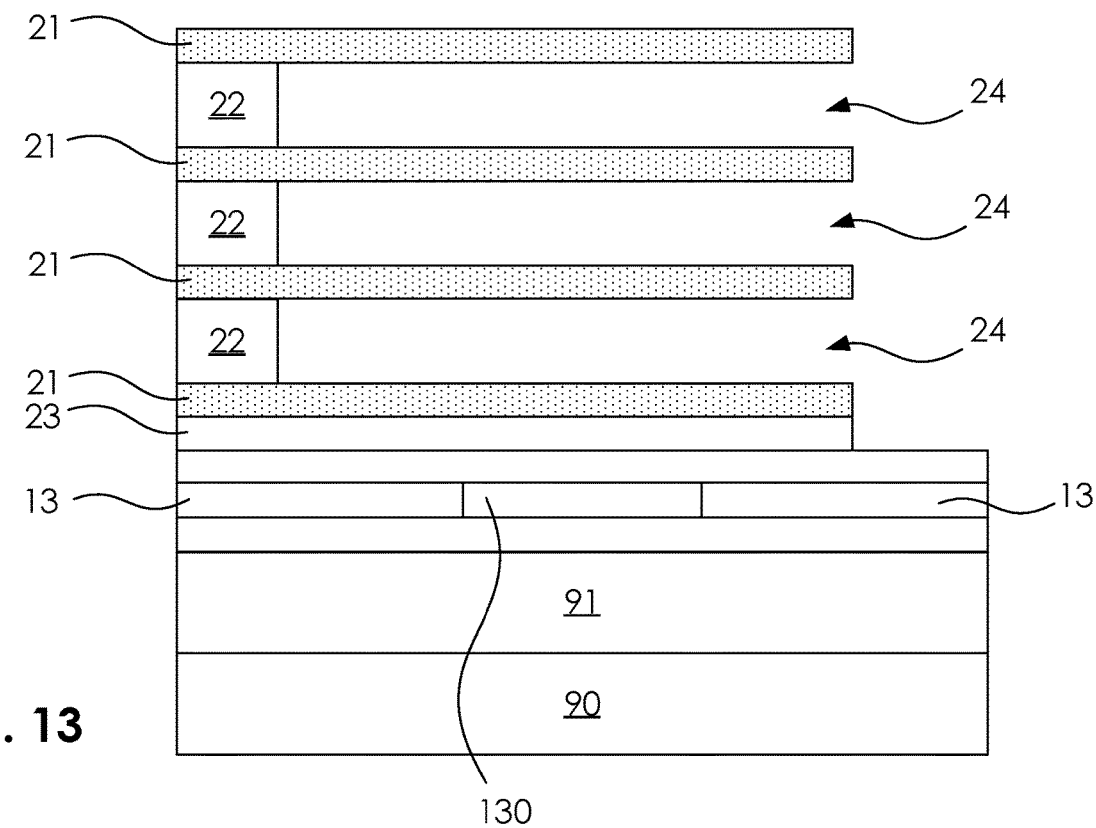

As shown in FIGS. 12 and 13, in some embodiments, a portion of the plurality of first isolation layers 21 and a portion of the plurality of second isolation layers 22 may be patterned to exposure a portion of the source region 11 prior to forming a plurality of lateral recesses 24 in the second isolation layer 22. The plurality of lateral recesses 24 are vertically overlapping the channel structure 13. In some embodiments, each of the second isolation layers 22 is implemented as a dummy layer, which means the usage of each of the second isolation layers 22 is at least to provide a sufficient height for accommodating the capacitor structure in the lateral recesses 24. Moreover, in such embodiments, each of the first isolation layers 21 is implemented as a bottom metal isolation layer for isolating the bottom metal layer formed later, along an elevation direction.

Figure 14:
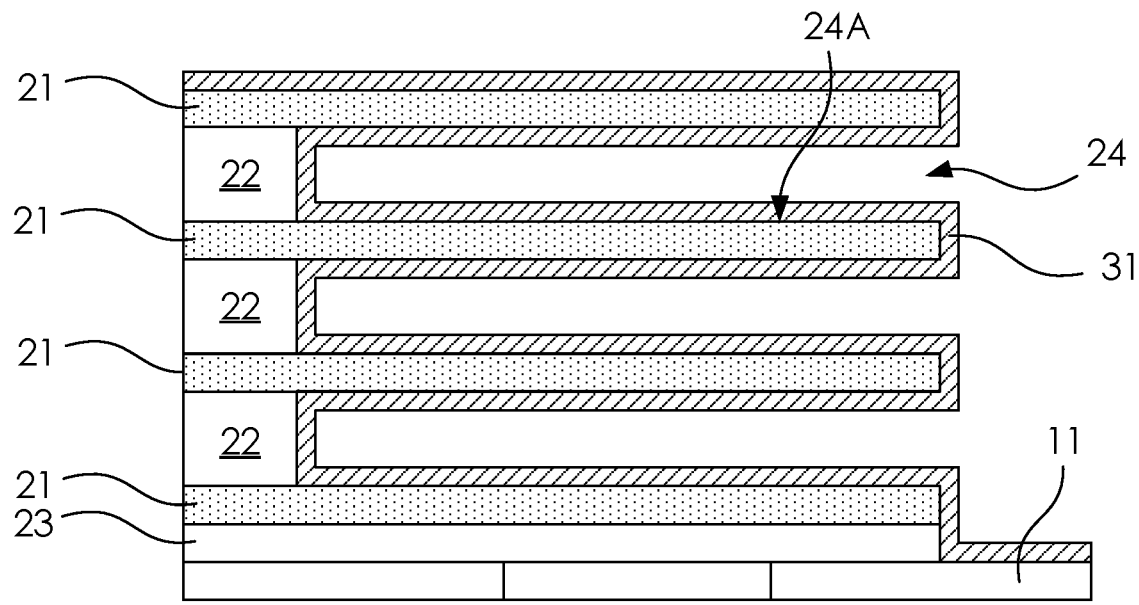
FIGS. 14 to 17 illustrate cross-sectional views of forming a capacitor structure according to some embodiments of the present disclosure.
Figure 15:
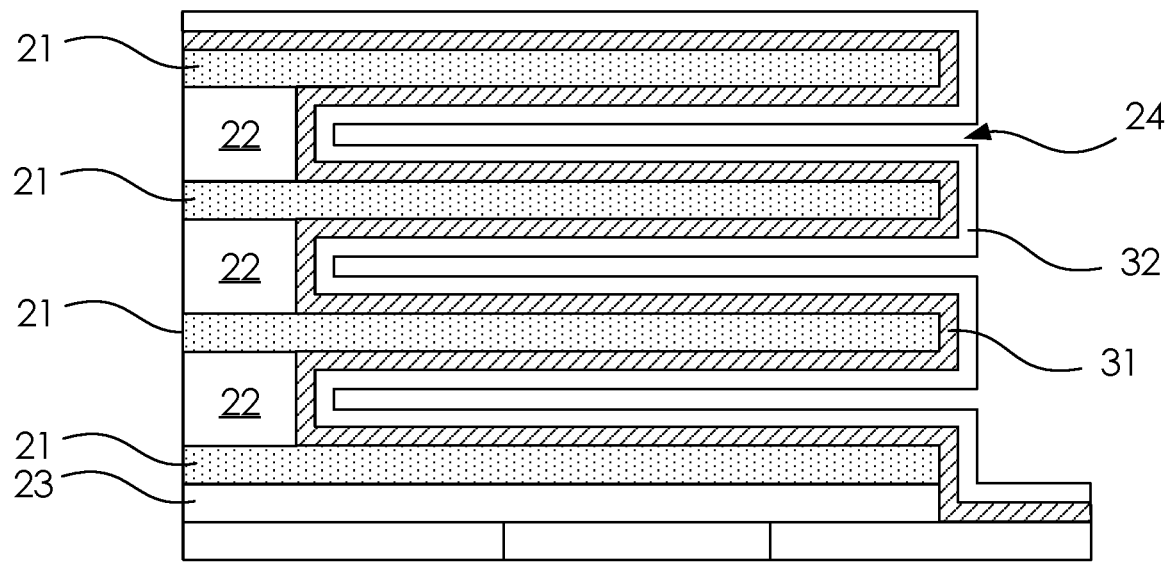
Figure 16:
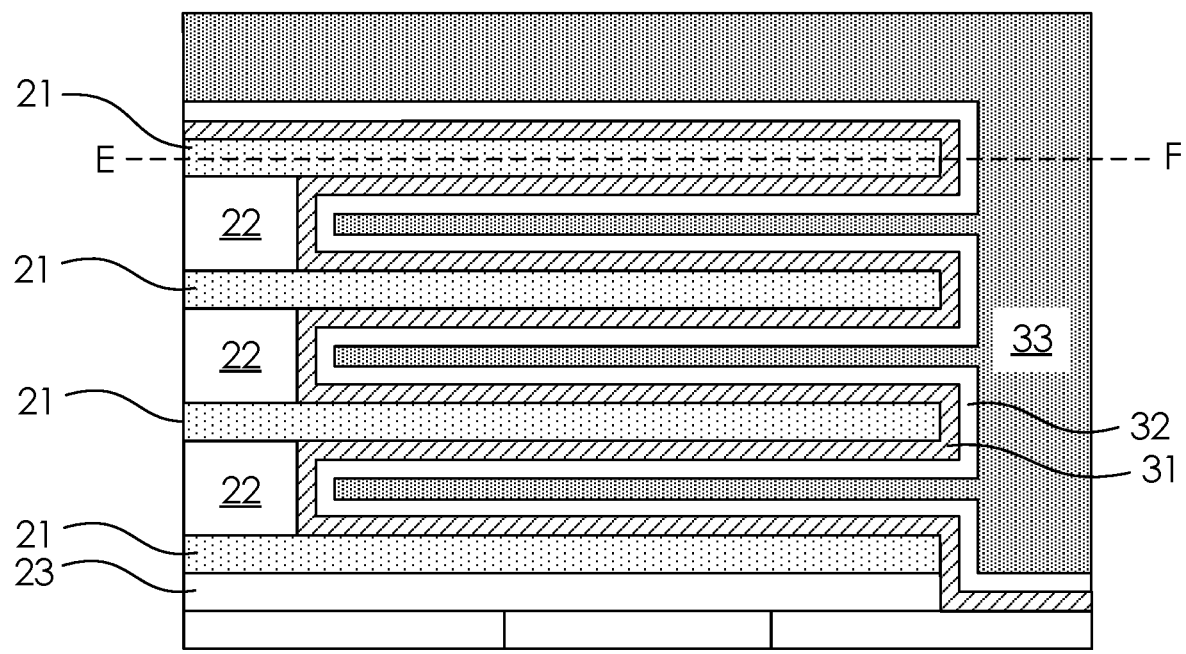

As shown in FIGS. 14, 15, and 16, in some embodiments, the capacitor structure 30 of DRAM may be formed in the lateral recesses 24 and in contact with the exposed source region 11. The capacitor structure 30 may be a MIM structure, wherein the bottom metal layer 31, the dielectric layer 32, and the top metal layer 33 as previously shown in FIG. 1 may be formed by deposition process such as PVD, CVD, or ALD subsequently.

In some embodiments, the bottom metal layer 31 is formed on the exposed source region 11 and conformal to the sidewall 24A of each of the lateral recesses 24. The dielectric layer 32 is formed on the bottom metal layer 31 and conformal to the bottom metal layer 31 in each of the lateral recesses 24. The top metal layer 33 is formed on the dielectric layer 32 and laterally covers the dielectric layer 32 and each of the lateral recesses 24. In some embodiments, the bottom metal layer 31 and the top metal layer 32 is made by metal such as aluminum (Al), titanium (Ti), titanium nitride (TiN), tantalum nitride (TaN), cobalt (Co), silver (Ag), gold (Au), copper (Cu), nickel (Ni), chromium (Cr), hafnium (Hf), ruthenium (Ru), tungsten (W), platinum (Pt), etc. In some embodiments, the materials of the bottom metal layer 31 and the top metal layer 32 are the same. In some embodiments, the bottom metal layer 31 and the top metal layer 32 are made by different materials. In some embodiments, the dielectric layer 32 is made by dielectric materials such as $HfO_2$, $Hr_{1-x}Zr_xO_2$, $ZrO_2$, $TiO_2$, NiO, $TaO_x$, $Cu_2O$, $Nb_2O_5$, $Al_2O_3$, etc.

Figure 17:
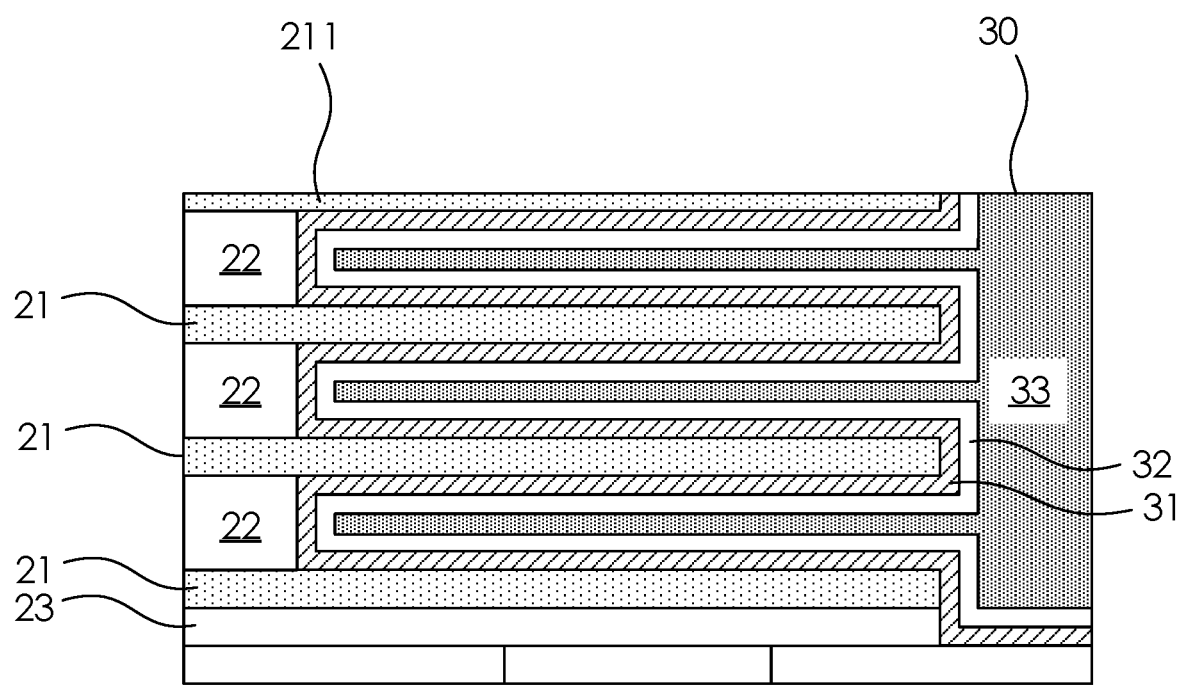
Figure 18A:
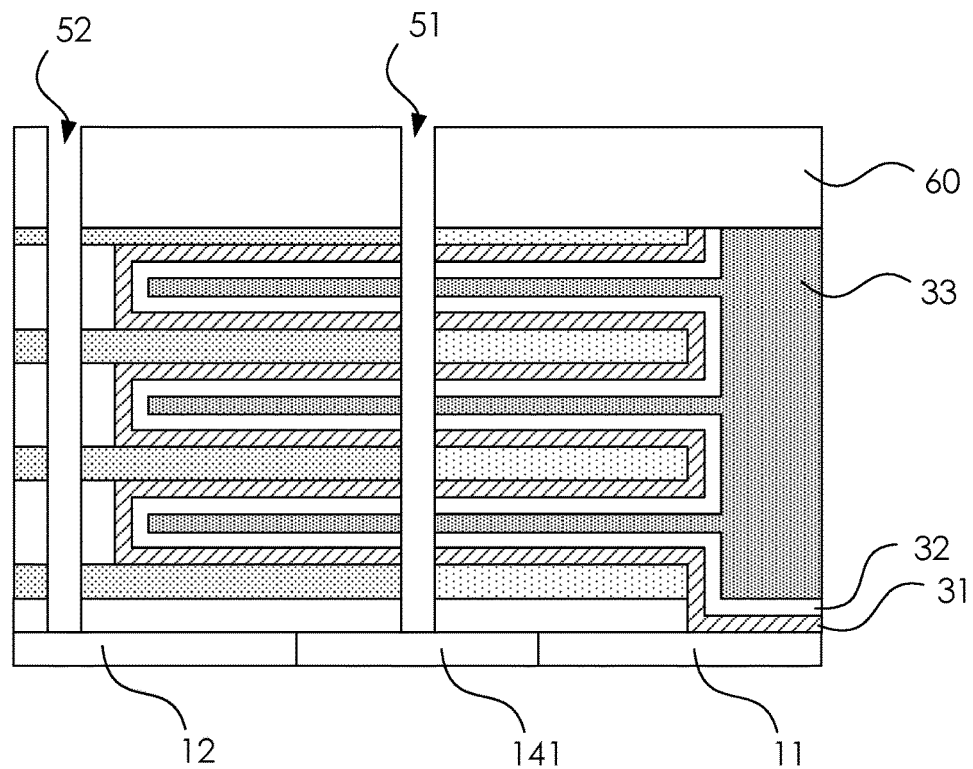
FIGS. 18A to 18F illustrate cross-sectional views of forming contacts according to some embodiments of the present disclosure.
Figure 18B:
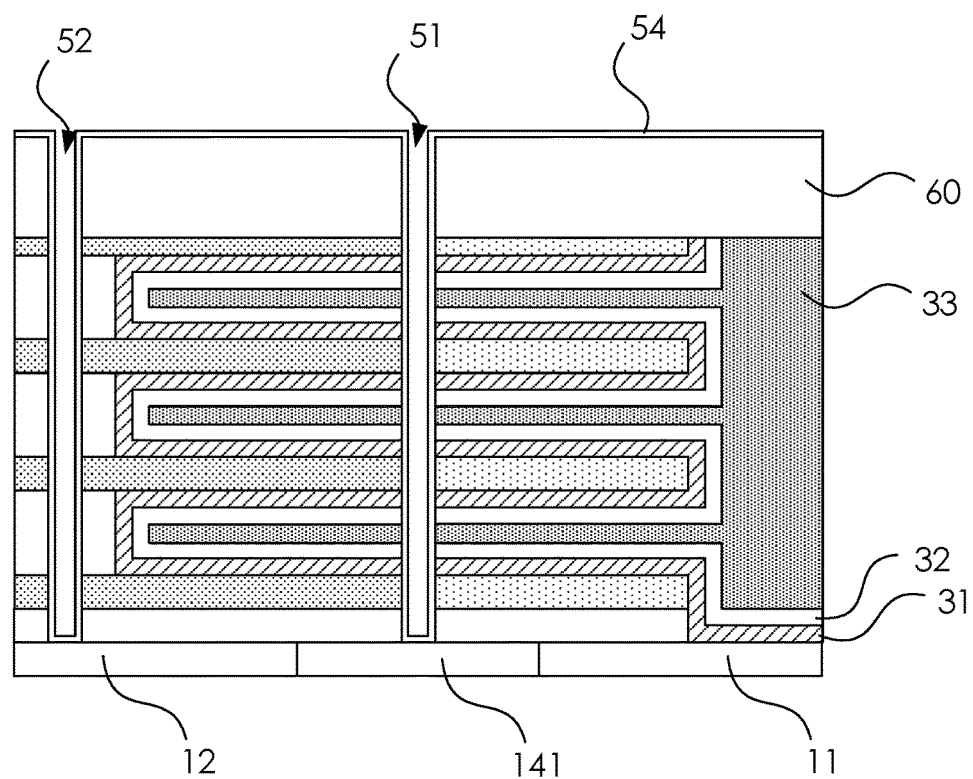
Figure 18C:
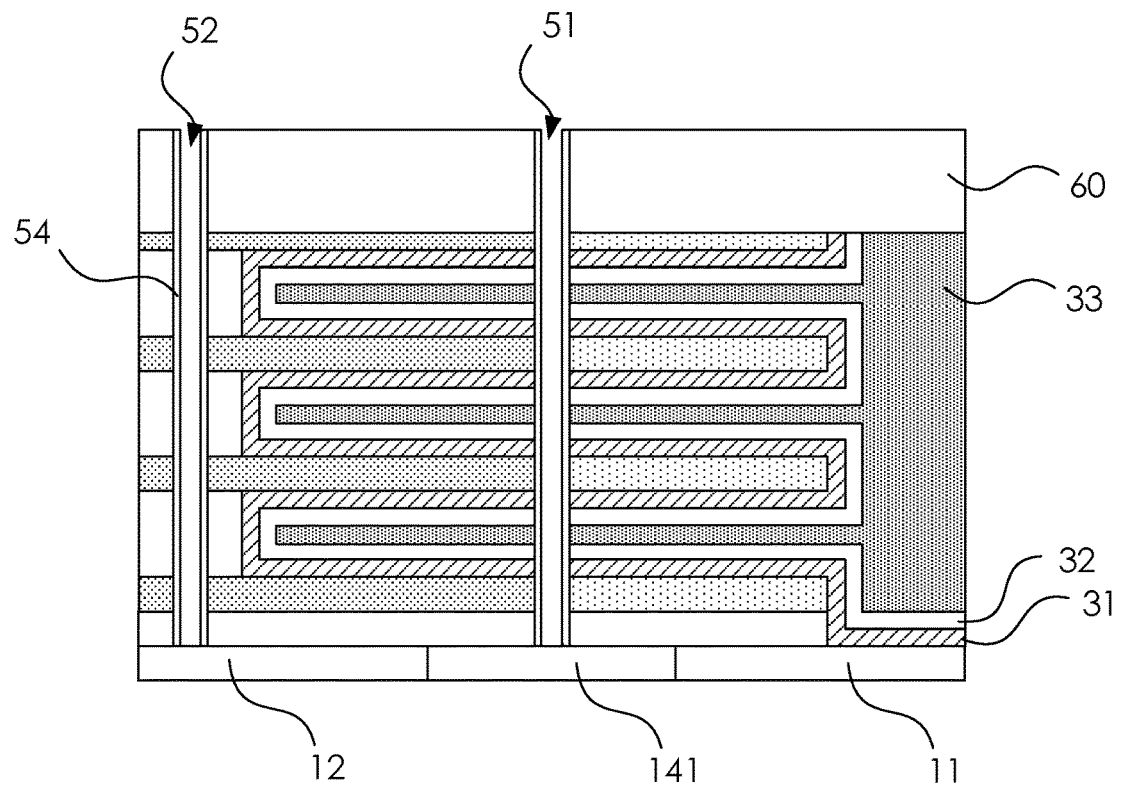
Figure 18D:
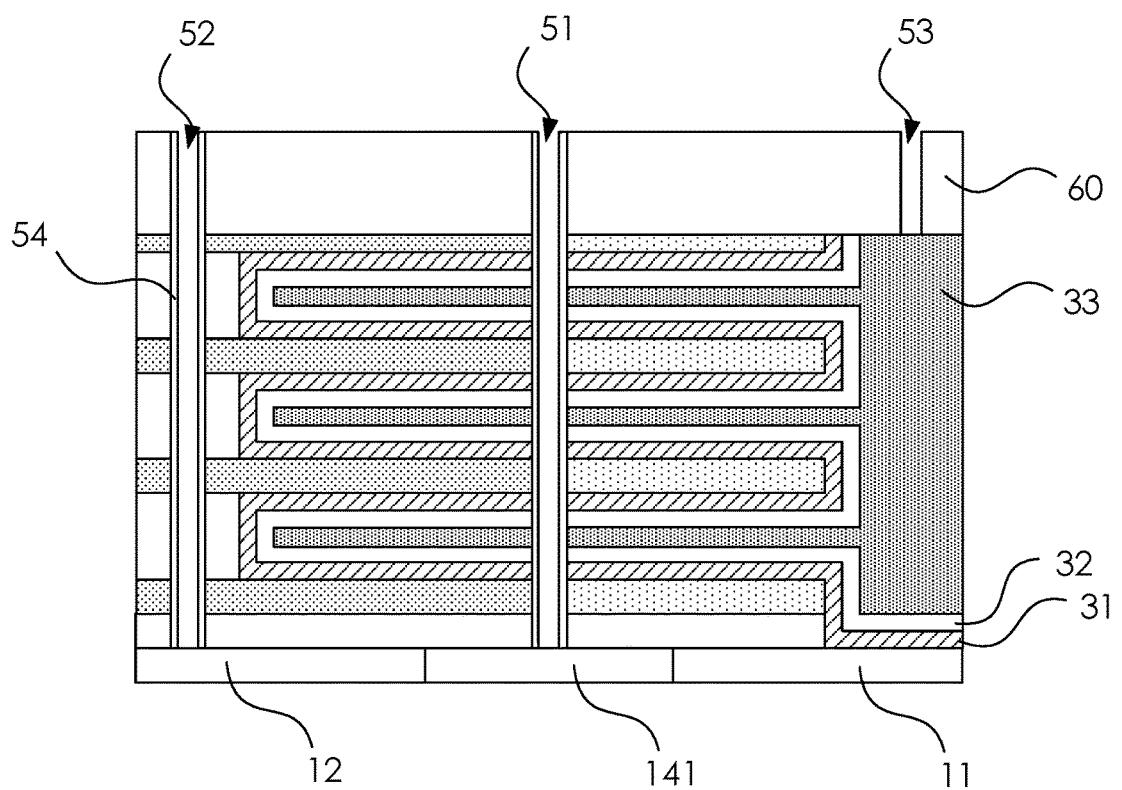
Figure 18E:
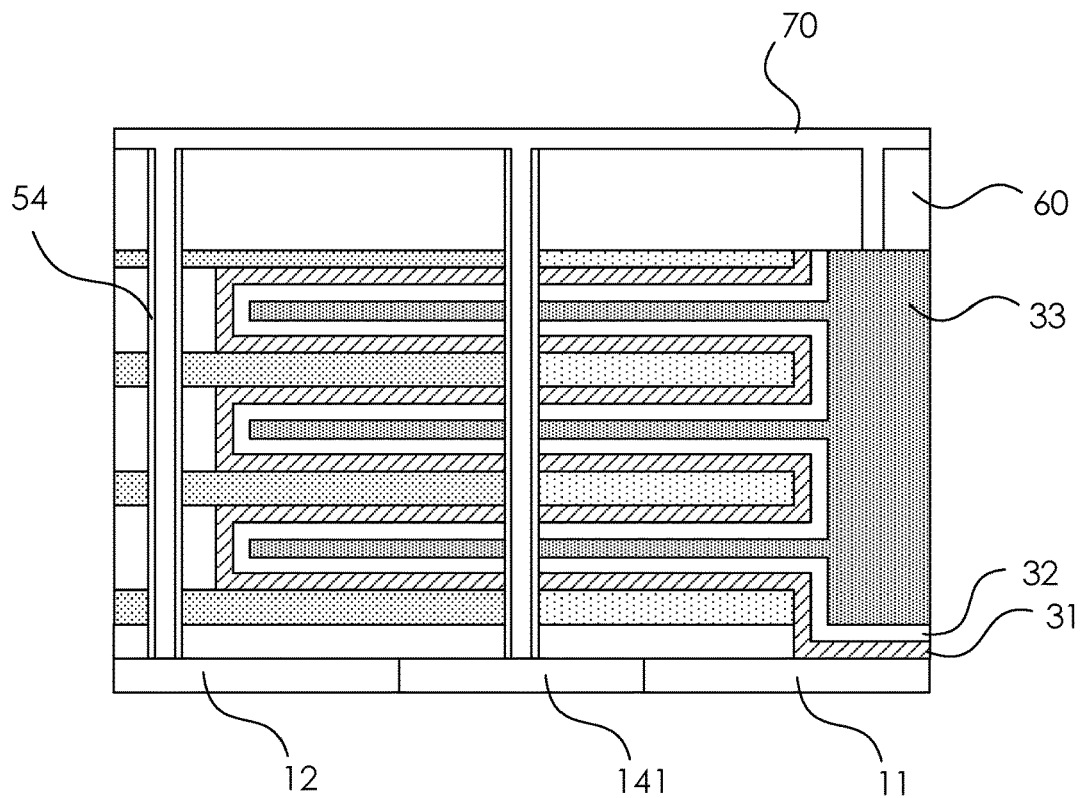
Figure 18F:
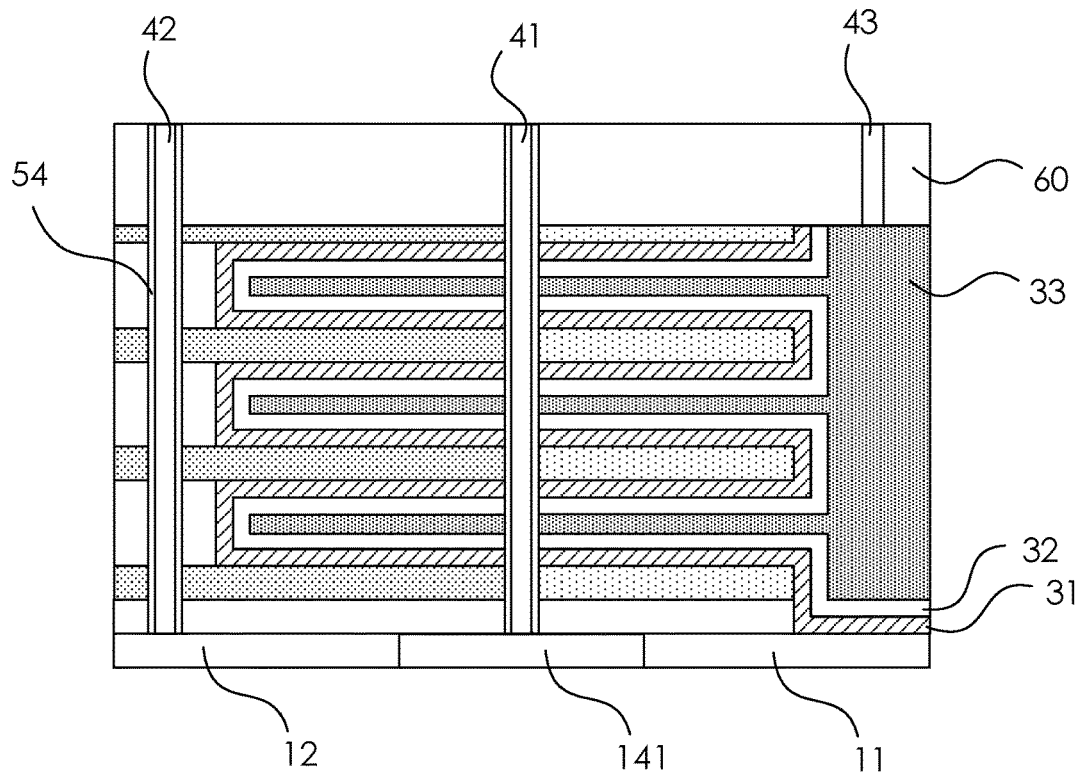

As shown in FIG. 17, in some embodiments, a top portion of the capacitor structure 30 may be planarized through a CMP operation to remove the excessive materials including a portion of the top metal layer 31, a portion of the dielectric layer 32, and a portion of the top metal layer 33 previously deposited over line EF as shown in FIG. 16. In such embodiments, a portion of the top metal layer 31 may be removed to expose an edge of the bottom metal layer 31 and an edge of the dielectric layer 32. In such embodiments, a topmost first isolation layer 211 may be thinner than the first isolation layers there below due to CMP process. In such embodiments, the topmost first isolation layer 211 and capacitor structure 30 may be planarized to provide a flattened surface topography.

In the operation of forming the via connections of DRAM, as shown in FIGS. 18A to 18F, in some embodiments, a first hole 51 may be formed by penetrating the plurality of first isolation layers 21 to expose the metal gate 141 on the channel structure. In some embodiments, an inter-metal dielectric (IMD) layer 60 made by oxides may be formed over the isolation structure 20 and the transistor structure 30 prior to forming the first hole 51, and therefore the IMD layer 60 is penetrated by the first hole 51 as well. Next, an oxide layer 54 is formed in the first hole 51, the oxide layer 54 is used as a sidewall oxide layer for preventing short circuit. Because the bottom of the first hole 51 is also covered by the oxide layer 54, a portion of the oxide layer 54 (i.e., the oxide layer 54 directly on the metal gate 141) shall be removed to expose the metal gate 141 prior to filling a conductive material 70 in the first hole 51 to form the gate contact 41. The excessive conductive material 70 over the IMD layer 60 may be removed by a CMP operation.

In some embodiments, a second hole 52 for forming the drain contact 42 may be formed concurrently with forming the first hole 51, whereas the second hole 52 is formed to expose the drain region 12. In some embodiments, a third hole 53 may be formed over the top metal layer 33, wherein the sidewall of the third hole 53 does not need to be covered by oxides. That is, the source contact 43 is laterally surrounded by the IMD layer 60 directly.

According to the present disclosure, a semiconductor structure and method for manufacturing thereof are disclosed. Overall, the disclosed semiconductor structure includes a transistor and a stackable capacitor both in a BEOL structure, the stackable capacitor may include a plurality of lateral fin structures to increase the area of the capacitor though using the space in the BEOL structure along a vertical direction, and therefore the density and the performance of the memory may be improved.

In one exemplary aspect, a semiconductor structure is provided. The semiconductor structure includes a substrate, a front end of line (FEOL) structure, and a metallization structure. The FEOL structure is disposed over the substrate. The metallization structure is over the FEOL structure. The metallization structure includes a transistor structure, an isolation structure, and a capacitor. The transistor structure has a source region and a drain region connected by a channel structure. The isolation structure is over the transistor structure and exposing a portion of the source region, and a side of the isolation structure has at least a lateral recess vertically overlaps the channel structure. The capacitor is in contact with the source region and disposed conformal to the lateral recess.

In another exemplary aspect, a semiconductor structure is provided. The semiconductor structure includes a substrate, a front end of line (FEOL) structure, a memory structure, and a plurality of first isolation layers. The (FEOL) structure is disposed over the substrate. The memory structure is over the FEOL structure. The memory structure includes a transistor structure and a capacitor structure. The transistor structure is over the FEOL structure having a source region and a drain region connected by a channel structure. The capacitor structure is over the transistor structure. The capacitor structure includes bottom metal layer, a dielectric layer, and a top metal layer. The bottom metal layer is in contact with the transistor structure. The dielectric layer is on the bottom layer. The top metal layer is on the dielectric layer having a plurality of lateral fins. The plurality of first isolation layers are arranged alternated with the lateral fins of the top metal layer over the transistor structure. The plurality of lateral fins and the plurality of first isolation layers overlap the channel structure from a top view perspective.

In yet another exemplary aspect, a method for manufacturing a semiconductor structure is provided. The method includes the operations as follows. A substrate having a front end of line (FEOL) structure over a surface of the substrate is received. A transistor structure over the FEOL structure is formed. The transistor structure includes a source region, a drain region, and a channel structure connecting the source region and the drain region. A plurality of first isolation layers and a plurality of second isolation layers formed alternatively over the transistor structure. A portion of the plurality of first isolation layers and the plurality of second isolation layers are patterned to exposure a portion of the source region. A portion of the second isolation layers is patterned to form a plurality of lateral recesses vertically overlapping the channel structure. A capacitor is formed in the plurality of lateral recesses.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a front end of line (FEOL) structure disposed over the substrate;
   a metallization structure over the FEOL structure, the metallization structure comprises:
      a transistor structure having a source region and a drain region connected by a channel structure;
      an isolation structure over the transistor structure and exposing a portion of the source region, and a side of the isolation structure having at least a lateral recess vertically overlaps the channel structure; and
      a capacitor over the transistor structure and laterally adjacent to the isolation structure and in contact with the source region and disposed conformal to the lateral recess;
   an inter-metal dielectric (IMD) layer over the capacitor;

a source contact extending from the capacitor and penetrating the IMD layer; and a drain contact extending from the drain region and penetrating the isolation structure and the IMD layer.

2. The semiconductor structure of claim 1, wherein the capacitor comprises:

a bottom metal layer in contact with the source region and disposed conformal to a sidewall of the lateral recess;

a dielectric layer on the bottom metal layer and disposed conformal to the bottom metal layer in the lateral recess; and a top metal layer on the dielectric layer and laterally covers the dielectric layer and the lateral recess.

3. The semiconductor structure of claim 1, wherein the isolation structure comprises:

a plurality of first isolation layers; and a plurality of second isolation layers;

wherein each of the second isolation layers is sandwiched by two of the first isolation layers.

4. The semiconductor structure of claim 3, wherein a material of the first isolation layer comprises a different etching selectivity from a material of the second isolation layer.

5. A semiconductor structure, comprising:

a substrate;

a front end of line (FEOL) structure disposed over the substrate;

a memory structure over the FEOL structure, the memory structure comprising:

a transistor structure over the FEOL structure having a source region and a drain region connected by a channel structure; and a capacitor structure over the transistor structure, the capacitor structure comprises:

a bottom metal layer in contact with the transistor structure;

a dielectric layer on the bottom layer; and a top metal layer on the dielectric layer having a plurality of lateral fins; and a plurality of first isolation layers laterally adjacent to the capacitor structure and arranged alternated with the lateral fins of the top metal layer over the transistor structure;

wherein the plurality of lateral fins and the plurality of first isolation layers overlap the channel structure from a top view perspective.

6. The semiconductor structure of claim 5, further comprising an etch stop layer on the transistor structure and exposing a portion of the source region.

7. The semiconductor structure of claim 6, wherein a material of the etch stop layer is different to a material of the first isolation layer.

8. The semiconductor structure of claim 5, wherein the top metal layer further comprises a base portion over the source region, each of the lateral fins are connected to a side of the base portion of the top metal layer.

9. The semiconductor structure of claim 5, further comprising a plurality of second isolation layers arranged alternated with the plurality of first isolation layers.

10. The semiconductor structure of claim 9, wherein a side of each of the second isolation layers are in contact with the bottom metal layer.

11. A method for manufacturing a semiconductor structure, comprising:

receiving a substrate having a front end of line (FEOL) structure over a surface of the substrate;

forming a transistor structure over the FEOL structure, the transistor structure comprises a source region, a drain region, and a channel structure connecting the source region and the drain region;

forming a plurality of first isolation layers and a plurality of second isolation layers alternatively over the transistor structure;

patterning a portion of the plurality of first isolation layers and the plurality of second isolation layers to expose a portion of the source region;

patterning a portion of the second isolation layers to form a plurality of lateral recesses vertically overlapping the channel structure; and forming a capacitor in the plurality of lateral recesses.

12. The method of claim 11, further comprising:

forming an etch stop layer on the transistor structure prior to forming the plurality of first isolation layers and the plurality of second isolation layers;

wherein the etch stop layer has a lower etch selectivity than the first isolation layer.

13. The method of claim 11, wherein forming the capacitor comprises:

forming a bottom metal layer on the source region and conformal to a sidewall of each of the lateral recesses;

forming a dielectric layer on the bottom metal layer and conformal to the bottom metal layer in each of the lateral recesses; and forming a top metal layer on the dielectric layer and laterally covers the dielectric layer and each of the lateral recesses.

14. The method of claim 13, further comprising:

planarizing the top metal layer of the capacitor to expose the bottom metal layer and the dielectric layer.

15. The method of claim 13, further comprising:

forming a first hole penetrates the plurality of first isolation layers to expose a metal gate on the channel structure;

forming an oxide layer in the first hole; and filling the first hole to form a gate contact.

16. The method of claim 15, further comprising:

removing a portion of the oxide layer to expose the metal gate prior to filling the first hole.

17. The semiconductor structure of claim 1, further comprising an etch stop layer on the transistor structure, the etch stop layer is leveled with the capacitor.

18. The semiconductor structure of claim 17, wherein a bottom metal layer of the capacitor is leveled with the etch stop layer, and a dielectric layer and a top metal layer of the capacitor are free from leveled with the etch stop layer.

19. The semiconductor structure of claim 1, further comprising a gate contact coupled to the gate structure, wherein each of the first isolations layers, the capacitor, and the IMD layer over the capacitor are penetrated by the gate contact.

20. The semiconductor structure of claim 3, wherein a topmost first isolation layer of the plurality of the first isolation layers is thinner than the first isolation layers covered by the topmost first isolation layer.

* * * * *